(12) United States Patent
Yu et al.

(10) Patent No.: US 7,250,719 B2
(45) Date of Patent: Jul. 31, 2007

(54) ORGANIC LIGHT EMITTING DIODE WITH BRIGHTNESS ENHANCER

(75) Inventors: Liang-Bin Yu, Taipei (TW); Tien-Shou Shieh, Taipei (TW); Hui-Lung Kuo, Taipei (TW); Mei-Rurng Tseng, Hsinchu (TW); Pin-Sien Yu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 233 days.

(21) Appl. No.: 11/205,408

(22) Filed: Aug. 16, 2005

(65) Prior Publication Data

US 2006/0145600 A1    Jul. 6, 2006

(30) Foreign Application Priority Data

Dec. 30, 2004    (TW) .............................. 93141345 A

(51) Int. Cl.
*H01J 1/62*    (2006.01)

(52) U.S. Cl. ...................................... 313/504; 313/506
(58) Field of Classification Search ................ 313/498, 313/504, 506
See application file for complete search history.

(56) References Cited

U.S. PATENT DOCUMENTS 6,721,030 B2    4/2004    Hsieh et al.

*Primary Examiner*—Vip Patel
(74) *Attorney, Agent, or Firm*—Quintero Law Office

(57) ABSTRACT

An organic light emitting diode (OLED) with a brightness enhancer. The OLED comprises a substrate having a first surface and a second surface oppositely. An anode electrode is disposed on the first surface of the substrate. An organic light emitting layer is disposed on the anode electrode. A cathode electrode is disposed on the organic light emitting layer. A brightness enhancer is disposed on the second surface of the substrate.

23 Claims, 2 Drawing Sheets

ORGANIC LIGHT EMITTING DIODE WITH BRIGHTNESS ENHANCER

BACKGROUND

The invention relates to an organic light emitting diodes (OLED) and in particular to an OLED with a brightness enhancer.

OLED qualities such as light weight, slim profile, low power consumption, wide viewing angle and fast response time make it is a popular display choice. When luminescent efficiency of the OLED reaches 100 Lm/W, it can replace conventional light sources. Thus improving OLED efficiency is an important issue.

Recently, lifetime and brightness of OLEDs have improved, but not substantially. Organic materials and glass substrate have a higher refraction than air, such that light easily reflects or emits from device sides. About 80% light is trapped in the device, making the quantum efficiency of OLED less than 20%.

An improved OLED device 10 is shown in FIG. 1, comprising polarizing film 11/substrate 13/anode electrode 14/organic light emitting layer 15/and cathode electrode 16 encapsulant (not shown). The metal electrode provides good the reflection performance, however, double image is induced by exterior light entering the OLED device and reflecting. A polarizing film 11 with a ¼ wavelength delayer layer eliminates this problem. However, polarizing film 11 decreases brightness by more than ½, because it not only blocks exterior light but also light emitting from the device.

SUMMARY

Accordingly, embodiments of the invention provide a organic light emitting diode (OLED) with a brightness enhancer.

In an embodiment of the invention, an organic light emitting diode (OLED) with a brightness enhancer comprises a substrate having a first surface and a second surface opposite thereto. An anode electrode is disposed on the first surface of the substrate. An organic light emitting layer is disposed on the anode electrode. A cathode electrode is disposed on the organic light emitting layer. A brightness enhancer is disposed on the second surface of the substrate.

In another embodiment, an organic light emitting diode (OLED) with a brightness enhancer comprises a substrate. An anode electrode is disposed on the substrate. An organic light emitting layer is disposed on the anode electrode. A cathode electrode is disposed on the organic light emitting layer. A brightness enhancer is disposed on the cathode electrode.

DESCRIPTION OF THE DRAWINGS

The embodiments can be more fully understood by reading the subsequent detailed description and examples with references made to the accompanying drawings, wherein.

DETAILED DESCRIPTION

Figure 1:
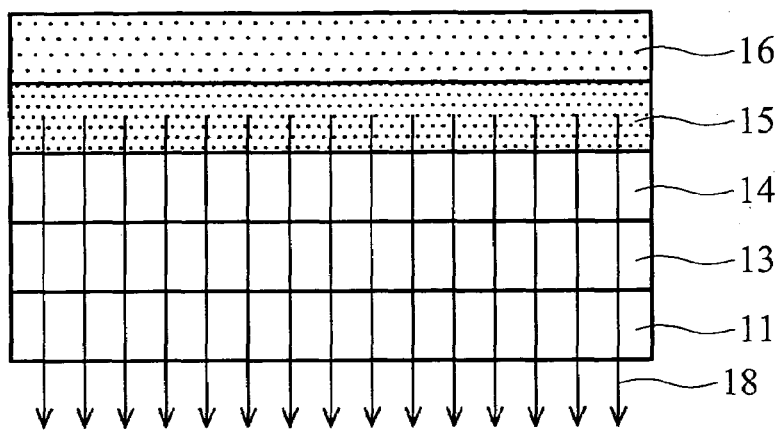
FIG. 1 is a cross section of a conventional OLED structure.
Figure 2:
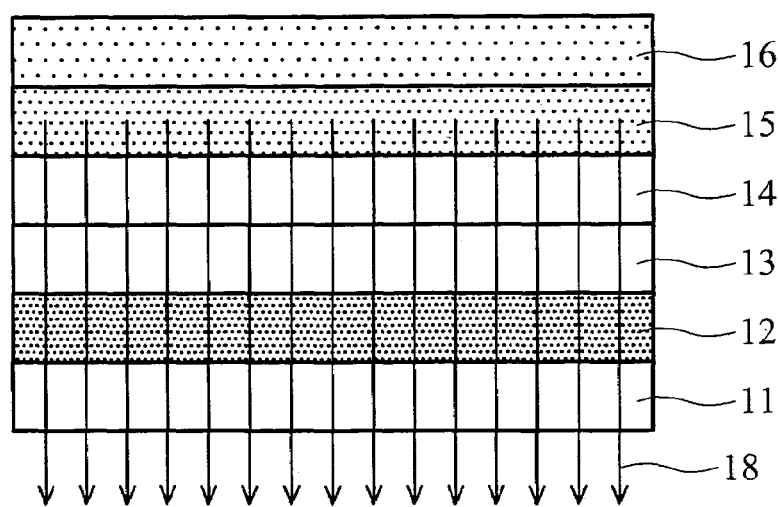
FIG. 2 is a cross section of an OLED with a brightness enhancer according to the first embodiment of the invention.
Figure 3:
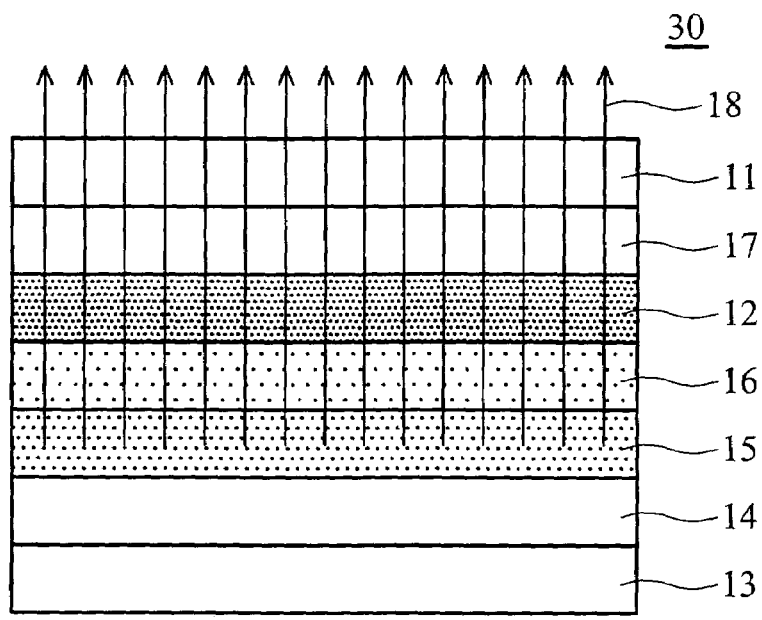
FIG. 3 is a cross section of an OLED with a brightness enhancer according to the second embodiment of the invention.
Figure 4:
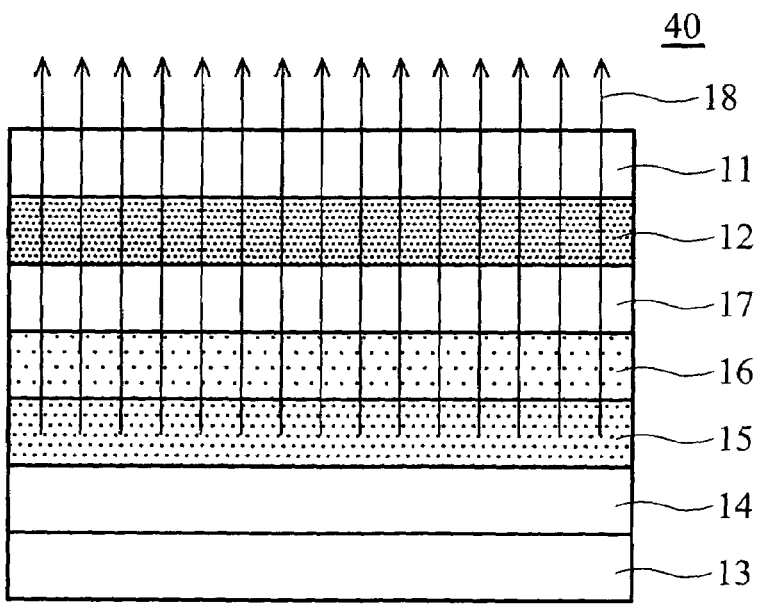
FIG. 4 is a cross section of an OLED with a brightness enhancer according to the third embodiment of the invention.

The invention provides an OLED to enhance luminescent efficiency. The OLED of the invention is a conventional OLED with a cholesterol liquid crystal thin film layer as a brightness enhancer, drawing trapped light out of the device to enhance luminescent efficiency. FIGS. 2~4 are cross sections of OLEDs with brightness enhancers.

First Embodiment

FIG. 2 is a cross section of an OLED with a brightness enhancer according to the first embodiment of the invention. The OLED comprises a substrate 13. An anode electrode 14 is formed on the substrate 13. The anode electrode 14 comprises a transparent electrode, a metal electrode or a complex electrode. An organic light emitting layer 15 is formed on the anode electrode 14. The organic light emitting layer 15 comprises monolayer or multilayer small molecular or polymer organic light emitting materials. The organic light emitting layer 15 is formed by thermal evaporating small molecular organic light emitting material under vacuum, or by spin-coating, ink-jetting or screen printing the polymer organic light emitting material. The organic light emitting layer 15 further comprises at least one electron injection layer and/or an electron transfer layer thereon, and at least a hole injection layer and a hole transfer layer beneath the organic light emitting layer 15.

A cathode electrode 16 is formed on the organic light emitting layer 15. The cathode electrode 16 comprises a transparent electrode, a metal electrode or a complex electrode. The anode electrode 14 and cathode electrode 16 are formed by sputtering, electron beam evaporation, thermal evaporation, chemical vapor deposition or spray pyrolysis. A brightness enhancer 12 is posted on the other surface of the substrate 13, and a polarizing film. 11 is posted on the brightness enhancer 12. The OLED has a structure comprising polarizing film 11/brightness enhancer 12/substrate 13/anode electrode 14/organic light emitting layer 15/cathode electrode 16. The invention is not limited to the above fabrication technologies, and other suitable methods can be used.

Since light 18 is emitted through the substrate 13 of the device 10, substrate 13 transparent, such as glass or plastic substrate. The polarizing film 11 polarizes light 18 due to dichromatic or double refraction of specific substance, or reflection or refraction at an interface between two substances. The brightness enhancer 12 comprises a cholesterol liquid crystal thin film layer or multilayer thin film layer, such as 3M. DBEF series device. Preferably, the anode electrode 14 comprises transparent indium tin oxide (ITO) or indium zinc oxide (IZO). The organic light emitting layer 15 preferably comprises OLED or polymer light emitting diode (PLED). The cathode electrode 16 preferably comprises Al, Mg, Ag, Ca or alloys thereof.

Second Embodiment

FIG. 3 is a cross section of an OLED with a brightness enhancer according to the second embodiment of the invention. The OLED 30 has a structure of substrate 13/node electrode 14/organic light emitting layer 15/cathode electrode 16/brightness enhancer 12/transparent encapsulant 17/polarizing film 11. The differences between the first and second embodiments are the brightness enhancer 12 posted on the cathode electrode 16, the brightness enhancer 12 encapsulated by the transparent encapsulant 17, and the polarizing film 11 posted on the transparent encapsulant 17. The invention is not limited to above fabrication technologies, and other suitable methods can be used.

Since light 18 is emitted through the cathode electrode 16 of the device, substrate 13 transparent or opaque, such as glass or plastic substrate. The anode electrode 14 comprises Pt or Au metal electrode; or indium tin oxide (ITO) or indium zinc oxide (IZO) electrode with Au, Ag or Al reflective thin film. The cathode electrode 16, transparent or semi-transparent, such as Al, Mg, Ag, Ca or alloys thereof; or indium tin oxide (ITO) or indium zinc oxide (IZO) electrode with Al, Mg, Ag, or Ca thin film. The transparent encapsulant 17 comprises transparent glass or plastic. Other materials of the device are the same as in the first embodiment.

Third Embodiment

FIG. 4 is a cross section of an OLED with a brightness enhancer according to the third embodiment of the invention. The OLED 40 has a structure comprising substrate 13/anode electrode 14/organic light emitting layer 15/cathode electrode 16/transparent encapsulant 17/brightness enhancer 12/polarizing film 11. The difference between the second and third embodiments is the brightness enhancer 12 position. Other fabrication and materials of the device are the same as in the second embodiment.

Example 1

First, a glass substrate 13 was provided. 150 nm indium tin oxide (ITO) was formed on the glass substrate 13 by sputtering under $10^{-3}$ torr at room temperature as a transparent anode electrode 14. 100 nm OLED material was formed on the anode electrode 14 by vacuum thermal evaporation as an organic light emitting layer 15. 120 nm Al metal layer was formed by vacuum thermal evaporation as a cathode electrode 16. 10 μm cholesterol liquid crystal thin film layer was post on another side of the substrate 13 as a brightness enhancer 12. A commercially available polarizing film 11 was posted on the brightness enhancer 12, providing OLED structure 20 of polarizing film 11/brightness enhancer 12/substrate 13/anode electrode 14/organic light emitting layer 15/cathode electrode 16/encapsulant (not shown).

The brightness of 0°, 10°, 20°, 30° from normal of structure 20 are shown in Table 1. This OLED with brightness enhancer provides a 1.5~1.7 times the brightness of OLED without the brightness enhancer.

Example 2

The fabrication method and materials of Example 2 are the same as Example 1, except the brightness enhancer 12 was synthesized by the fabrication method disclosed in U.S. Pat. No. 6,721,030, with 420~720 nm reflective wavelength range. The brightness of this example is shown in Table 1.

Example 3

The fabrication method and materials of Example 3 are the same as example 1, except the brightness enhancer 12 was synthesized by the fabrication method disclosed in U.S. Pat. No. 6,721,030, with 420~810 nm reflective wavelength range. The brightness of this example is shown in Table 1.

Comparison Example

The fabrication method and materials of the comparative Example are the same with Example 1, except there is no brightness enhancer 12 in the device. The brightness of this comparison example is shown in Table 1.

TABLE 1

| Sample No. | Test angle | Brightness 1 (cd/m$^2$) | Brightness 2 (cd/m$^2$) | Brightness 3 (cd/m$^2$) | Brightness 4 (cd/m$^2$) | Average (cd/m$^2$) |
|---|---|---|---|---|---|---|
| Example 1 | 0° | 909 | 917.7 | 921.3 | 912.6 | 915.2 |
|  | 10° | 925.3 | 934.7 | 932 | 940.9 | 933.2 |
|  | 20° | 929.6 | 934.4 | 943.5 | 937 | 936.1 |
|  | 30° | 851.5 | 859.7 | 830.3 | 834.1 | 843.9 |
| Example 2 | 0° | 741.6 | 743.7 | 744.3 | 733.9 | 740.9 |
|  | 10° | 745.2 | 756.3 | 755 | 741.3 | 749.5 |
|  | 20° | 744.9 | 752 | 753 | 733.1 | 754.8 |
|  | 30° | 649.3 | 647.4 | 644.1 | 647.5 | 647.1 |
| Example 3 | 0° | 848.6 | 875.2 | 879 | 884.7 | 871.9 |
|  | 10° | 851.7 | 887.8 | 890.1 | 899.4 | 882.3 |
|  | 20° | 848.2 | 881 | 893.6 | 908.6 | 882.9 |
|  | 30° | 755.4 | 756 | 772.4 | 798.6 | 770.6 |
| Comparison Example | 0° | 578.9 | 576.6 | 564.3 | 568.2 | 572 |
|  | 10° | 582.9 | 569.3 | 563.6 | 563 | 569.7 |
|  | 20° | 601.2 | 588.5 | 582.5 | 579.6 | 588 |
|  | 30° | 567.4 | 561.5 | 549.9 | 550.6 | 557.4 |

The brightness enhancer of the present invention comprises a reflective polarization transform element. The reflective polarization transform element comprises a cholesterol liquid crystal thin film layer to polarize light into left and right polarized light. The opposite optical rotation light transmits the cholesterol liquid crystal thin film layer and the same optical rotation light is reflected. The reflected light is reversed to transmitted light by the metal layer as a reflective surface of the OLED and through ¼ wavelength delay layer to emit all the interior light. The brightness of the OLED is two times that of the conventional OLED. Above examples prove the OLED has 1.6 times the brightness of conventional OLED, requiring no added power.

While the invention has been described by way of Example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An organic light emitting diode (OLED) with a brightness enhancer, comprising:
   a substrate having a first surface and a second surface opposite thereto;
   an anode electrode disposed on the first surface of the substrate;
   an organic light emitting layer disposed on the anode electrode;
   a cathode electrode disposed on the organic light emitting layer; and
   a brightness enhancer disposed on the second surface of the substrate.

2. The OLED as claimed in claim 1, further comprising a polarizing film on the brightness enhancer.

3. The OLED as claimed in claim 1, wherein the substrate is transparent glass or plastic.

4. The OLED as claimed in claim 1, wherein the brightness enhancer is a reflective polarization transformation element.

5. The OLED as claimed in claim 4, wherein the brightness enhancer comprises at least a cholesterol liquid crystal thin film layer.

6. The OLED as claimed in claim 1, wherein the brightness enhancer is multilayered.

7. The OLED as claimed in claim 1, wherein the brightness enhancer comprises a film separating different polarized lights into transmitted and reflective light.

8. The OLED as claimed in claim 1, wherein the anode electrode is indium tin oxide (ITO) or indium zinc oxide (IZO).

9. The OLED as claimed in claim 1, wherein the organic light emitting layer is OLED or polymer light emitting diode (PLED).

10. The OLED as claimed in claim 1, wherein the organic light emitting layer further comprises at least one electron injection layer, an electron transfer layer, a hole injection layer and a hole transfer layer.

11. The OLED as claimed in claim 1, wherein the cathode electrode is Al, Mg, Ag, Ca or alloys thereof.

12. An organic light emitting diode (OLED) with a brightness enhancer, comprising:
   a substrate;
   an anode electrode disposed on the substrate;
   an organic light emitting layer disposed on the anode electrode;
   a cathode electrode disposed on the organic light emitting layer; and
   a brightness enhancer disposed on the cathode electrode.

13. The OLED as claimed in claim 12, further comprising a transparent encapsulant on one the OLED top or bottom surface.

14. The OLED as claimed in claim 12, further comprising a polarizing film on the outermost OLED.

15. The OLED as claimed in claim 12, wherein the substrate is transparent or opaque glass or plastic substrate.

16. The OLED as claimed in claim 12, wherein the brightness enhancer is a reflective polarization transform element.

17. The OLED as claimed in claim 16, wherein the brightness enhancer comprises at least a cholesterol liquid crystal thin film layer.

18. The OLED as claimed in claim 12, wherein the brightness enhancer is multilayered.

19. The OLED as claimed in claim 12, wherein the brightness enhancer is a film separating different polarized light into transmitted and reflective light.

20. The OLED as claimed in claim 12, wherein the anode electrode is Pt, or Au metal electrode; or indium tin oxide (ITO) or indium zinc oxide (IZO) electrode with Au, Ag, or Al reflective layer.

21. The OLED as claimed in claim 12, wherein the organic light emitting layer is OLED or polymer light emitting diode (PLED).

22. The OLED as claimed in claim 12, wherein the organic light emitting layer further comprises at least one electron injection layer, an electron transfer layer, a hole injection layer and a hole transfer layer.

23. The OLED as claimed in claim 12, wherein the cathode electrode is Al, Mg, Mg, Ca or alloys thereof; or indium tin oxide (ITO) or indium zinc oxide (IZO) electrode with Al, Mg, Ag, or Ca thin film.

* * * * *